(12) United States Patent
Wang et al.

(10) Patent No.: US 6,448,167 B1
(45) Date of Patent: Sep. 10, 2002

(54) PROCESS FLOW TO REDUCE SPACER UNDERCUT PHENOMENA

(75) Inventors: Ling-Sung Wang, Hsin-Chu (TW); Ying-Lin Chen, Taichung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/027,976

(22) Filed: Dec. 20, 2001

(51) Int. Cl.$^7$ .......................................... H01L 21/4763
(52) U.S. Cl. ........................ 438/595; 438/305; 438/761; 438/568
(58) Field of Search .................................. 438/595, 761, 438/514, 568, 303–308, 299, 709

(56) References Cited

U.S. PATENT DOCUMENTS 6,153,483 A * 11/2000 Yeh et al. .................... 438/299

* cited by examiner

Primary Examiner—Keith Christianson
Assistant Examiner—Yennhu B. Huynh
(74) Attorney, Agent, or Firm—George O. Saile; Stephen B. Acke

(57) ABSTRACT

A process for forming a composite insulator spacer on the sides of a MOSFET gate structure, wherein the underlying component of the composite insulator spacer is comprised of a thin silicon oxide layer obtained via chemical vapor deposition procedures using tetraethylorthosilicate (TEOS), as a source, has been developed. To densify the underlying thin silicon oxide layer an anneal procedure usually performed after implantation of ions used for a lightly doped source/drain region, is delayed and performed after deposition of the thin silicon oxide layer. The anneal procedure is then used for both activation of the lightly doped source/drain ions, and densification of the thin silicon oxide layer. The etch rate of the densified silicon oxide layer, in dilute hydrofluoric acid procedures is now reduced allowing the underlying silicon oxide component, of the composite insulator spacer, to survive subsequent wet clean procedures employing dilute hydrofluoric acid.

26 Claims, 5 Drawing Sheets

PROCESS FLOW TO REDUCE SPACER UNDERCUT PHENOMENA

BACKGROUND OF THE INVENTION (1) Field of the Invention

The present invention relates to methods used to fabricate semiconductor devices, and more specifically to a method used to form, and retain during subsequent processing steps, a composite insulator spacer located on the sides of a gate structure.

(2) Description of Prior Art

The advent of micro-miniaturization, or the ability to fabricate semiconductor devices with sub-micron features, has resulted in improved device performance as well as decreases in processing costs. Smaller device features allow reductions in performance degrading parasitic junction capacitances to be realized. In addition a greater number of smaller semiconductor chips comprised with sub-micron features, but still exhibiting device densities equal to, or greater than, counterpart semiconductor chips fabricated with larger features, can be obtained from a specific size starting substrate thus reducing the processing cost for an individual semiconductor chip. However the trend to micro-miniaturization can place stringent demands on specific semiconductor elements. For example for sub-0.13 um technology the insulator spacer formed on the sides of a gate structure can be less than 700 Angstroms in thickness. The use of silicon oxide as a component of an insulator spacer, as well as the number of times during a process a semiconductor device is subjected to an hydrofluoric (HF), containing wet clean procedure, can result in undesired thinning of the silicon oxide spacer, or if silicon oxide is employed as an underlying layer of a composite insulator spacer, severe undercutting of the silicon oxide insulator spacer component. The undercut, silicon oxide spacer, subsequently filled with metal silicide, can result in yield loss due to gate to substrate shorts or leakage.

This invention will teach a process flow in which a thin, chemically vapor deposited (CVD), silicon oxide layer can be employed as an underlying layer for a composite insulator spacer as a result of a densification procedure performed to the silicon oxide component, allowing the removal rate of densified silicon oxide, in a HF type solution, to be reduced. The densified silicon oxide spacer component thus can survive exposures to HF containing wet etch clean procedures, C with a reduced amount of undercut when compared to counterparts formed with non-densified silicon oxide spacer components, thus reducing the risk of gate to substrate shorts or leakage. Prior art such as Das et al, in U.S. Pat. No. 6,113,128, as well as Thei et al, in U.S. Pat. No. 6,265,271, describe anneal procedures performed on silicon oxide layers, however these prior arts, do not describe the process sequence taught in this present invention, in which a specific process sequence is employed for densification of a silicon oxide spacer component, at a specific point of the process, prior to a series of wet clean procedures, performed using IF type solutions.

SUMMARY OF THE INVENTION

It is an object of this invention to fabricate a metal oxide semiconductor field effect transistor (MOSFET), device, featuring a composite insulator spacer, formed on the sides of a gate structure.

It is another object of this invention to form a composite insulator spacer comprised of a thin, underlying, CVD silicon oxide component, obtained using tetraethylorthosilicate (TEOS), as a source, a silicon nitride component, and an overlying, CVD silicon oxide component, again obtained using TEOS as a source.

It is still another object of this invention to subject the thin, underlying CVD silicon oxide layer, used to define a subsequent component of the composite insulator spacer, to an anneal procedure, prior to deposition of the silicon nitride layer, for purposes of densification, reducing the removal rate of the silicon oxide component in subsequent HF wet clean procedures.

In accordance with the present invention a method of densifing an underlying silicon oxide component of a composite insulator spacer, located on the sides of a gate structure, to reduce the extent of undercut of the underlying silicon oxide component during subsequent wet clean procedures is described. After formation of a gate structure on an underlying gate insulator layer, ions to be used for a lightly doped source/drain (LDD), region, are implanted in an area of a semiconductor substrate not covered by the gate structure A first silicon oxide layer is deposited, using TEOS as a source. A rapid thermal anneal (RTA) procedure is next used to density the first silicon oxide layer, resulting in a reduced removal rate for the densified silicon oxide layer, in HF containing solutions, when compared to undensified, TEOS deposited, silicon oxide counterparts. In addition the RTA procedure activates the implanted ions forming the lightly doped source/drain region. A silicon nitride layer is then deposited, followed by deposition of an overlying, overlying silicon oxide layer, again using TEOS as a source. An anisotropic, reactive ion etching (RIE), procedure is used to selectively form the initial composite spacer in the overlying, second silicon oxide layer, and in the silicon nitride layer, with the RIE procedure terminating at the appearance of the underlying, first silicon oxide layer. A first HF containing, wet etch procedure is employed to remove the portions of underlying, first silicon oxide layer, not covered by the initial composite spacer, resulting in the final composite spacer. After implantation of ions needed for a heavily doped source/drain region, in an area not covered by the gate structure or by the final composite insulator spacer, a resistor protect oxide (RPO) layer, is deposited followed by an anneal procedure used to activate the implanted ions, resulting in formation of the heavily doped source/drain region. Removal of the RPO layer is accomplished using another HF containing solution, followed by a pre-metal wet clean procedure, performed again in an HF containing solution. The extent of the undercut of underlying, first silicon oxide layer, exposed at the edge of the final composite insulator spacer during the HF cleans, is minimized as a result of the previously performed RTA, densification procedure. Metal silicide formation is then accomplished on the top surface of the gate structure, and on the heavily doped source/drain region.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
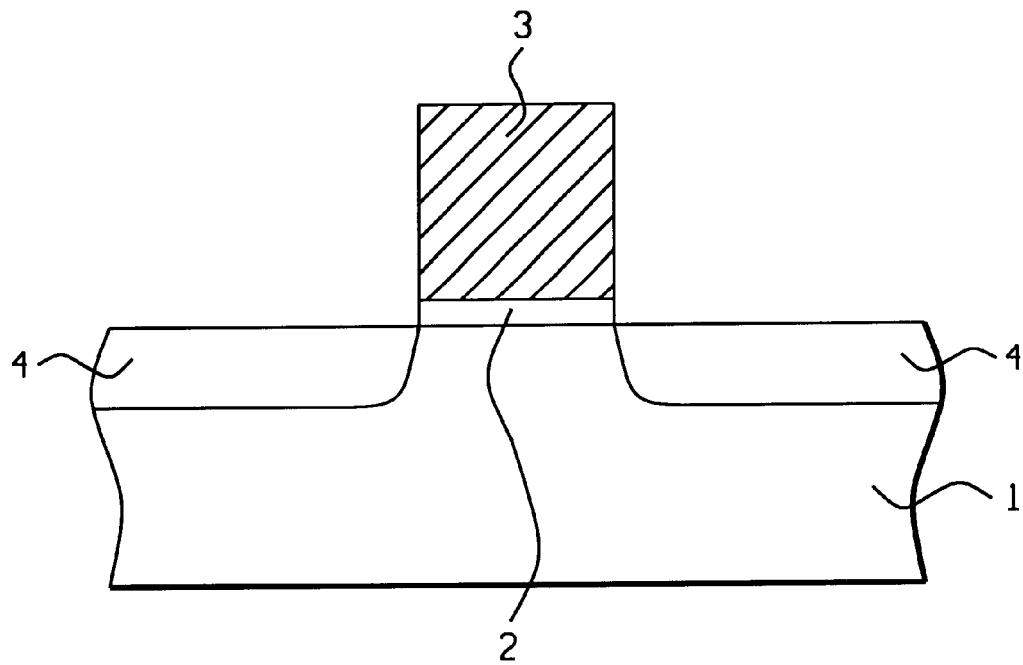
FIGS. 1–10, which schematically, in cross-sectional style, show key stages of fabrication used to form a MOSFET device, featuring a composite insulator spacer which in turn features an underlying, silicon oxide component, densified via an RTA procedure to reduce the extent of undercut in the underlying silicon onide component, occurring as a result of exposures to subsequent HF containing wet clean procedures.

The method of fabricating an MOSFET device, formed with a composite insulator spacer which features an underlying silicon oxide component, densified to reduce the extent of an undercut in the underlying silicon oxide component, occurring as a result of exposures to subsequent IF containing wet clean procedures, will now be described in detail. The process for a forming a composite insulator spacer featuring the anneal or densification procedure applied to the underlying silicon oxide spacer component, will be described for an N channel MOSFET device, however this process flow can also be used for P channel MOSFET, or complimentary (CMOS), devices. Semiconductor substrate 1, comprised of single crystalline P type silicon, with a <100> crystallographic orientation, is used and schematically shown in FIG. 1. Gate insulator layer 2, comprised of silicon dioxide at a thickness between about 20 to 70 Angstroms, is next thermally grown in an oxygen—steam ambient, followed by formation of gate structure 3. Gate structure 3, can be comprised of polysilicon or polycide (metal silicide—polysilicon). The polysilicon option employs deposition of a polysilicon layer, via low pressure chemical vapor deposition (LPCVD), procedures, at a thickness between about 1000 to 3000 Angstroms. The polysilicon layer can be doped in situ during deposition via the addition of arsine, or phosphine, to a silane ambient, or the polysilicon layer can be deposited intrinsically then doped via implantation of arsenic or phosphorous ions. A photoresist shape, (not shown in the drawings), is then used as an etch mask to allow an anisotropic RIE procedure, using $Cl_2$ or $SF_6$ as an etchant, to define polysilicon gate structure 3, comprised with a width between about 0.13 to 0.35 um. The polycide option again comprises deposition of an in situ doped polysilicon layer at a thickness between about 100 to 500 Angstroms, followed by deposition of an overlying metal silicide layer such as tungsten silicide or titanium silicide, at a thickness between about 100 to 500 Angstroms. This again is followed by the same photolithographic and RIE procedures used for the polysilicon option, resulting in the definition of polycide gate structure 3. After removal of the gate defining photoresist shape, via plasma oxygen ashing, arsenic or phosphorous are implanted in a region of semiconductor substrate 1, not covered by gate structure 3, at an energy between about 2 to 30 KeV, at a dose between about 1E12 to 5E13 atoms/$cm^2$, resulting in the region of implanted ions used to subsequently form lightly doped source/drain region 4. The result of these procedures is schematically shown in FIG. 1.

Figure 2:
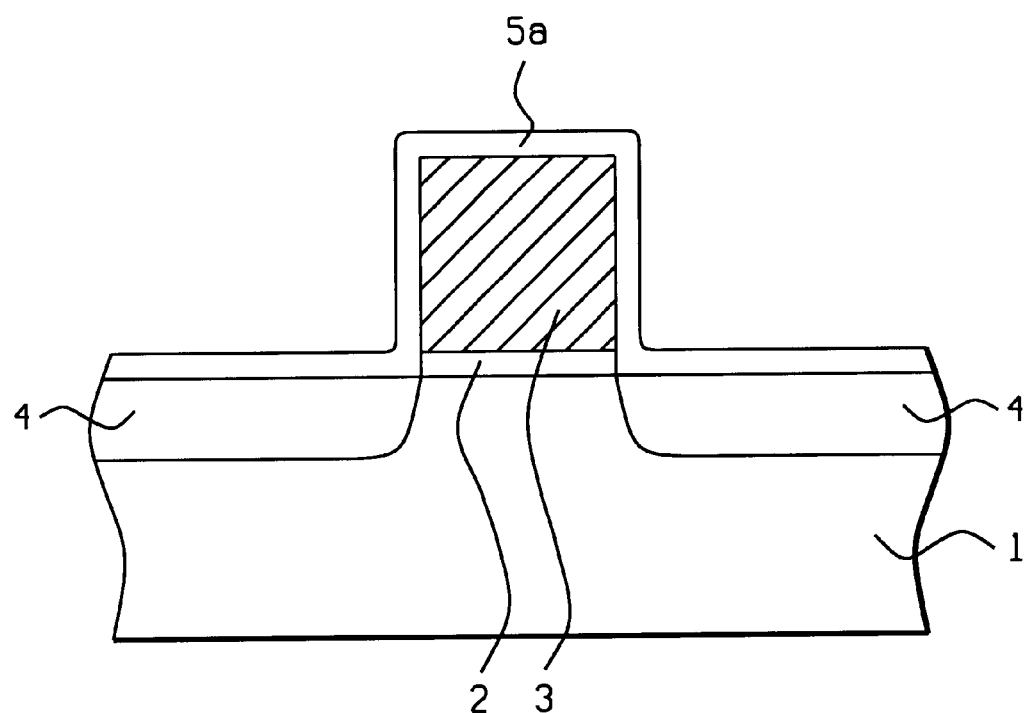
Figure 3:
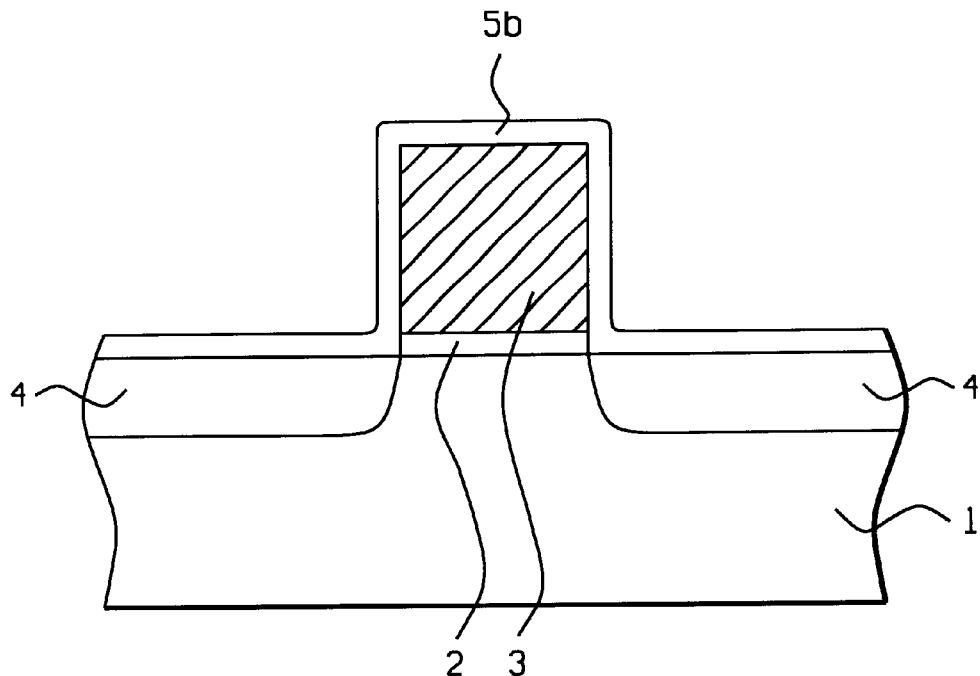

The initial step in formation of the desired composite insulator spacer starts with the deposition of silicon oxide layer 5a. Silicon oxide layer 5a, schematically shown in FIG. 2, is obtained at a thickness between about 125 to 175 Angstroms, via LPCVD or via plasma enhanced chemical vapor deposition (PECVD) procedures, using TEOS as a source. Since silicon oxide layer 5a, will subsequently be the underlying layer of the composite insulator spacer, after definition of the composite insulator spacer the edge of silicon oxide layer 5a, will be exposed to a series of wet clean procedures. The wet clean procedures used to remove other silicon oxide layers, or to prepare a semiconductor surface for metal deposition, are performed using HF containing solutions. The removal rate of undensified silicon oxide layer 5a, in 100:1 dilute hydrofluoric acid, (100:1 DHF), is between about 165 to 185 Angstroms/min. This high removal rate of silicon oxide layer 5a, in addition to the numerous exposures to the 100:1 DHF solution, can result in a severe loss of silicon oxide layer 5a, resulting in a severe undercut of the final composite insulator structure, where silicon oxide component 5a, is located underlying an unattacked silicon nitride spacer component. Therefore to reduce the removal rate of silicon oxide layer 5a, in a 100:1 DHF solution, a rapid thermal anneal (RTA), usually performed immediately after implantation of the lightly doped source/drain ions, is delayed and performed after deposition of silicon oxide layer 5a. The RTA procedure, used to both activate the lightly doped source/drain ions, as well as to density silicon oxide layer 5a, is performed at a temperature between about 800 to 1100° C., for a time between about 10 to 90 sec, in an argon or nitrogen ambient. The result of the RTA procedure is the densification of silicon oxide, resulting in silicon oxide layer 5b, shown schematically in FIG. 3, now exhibiting a reduced removal rate in 100:1 DHF, between about 115 to 135 Angstroms/min.

Figure 4:
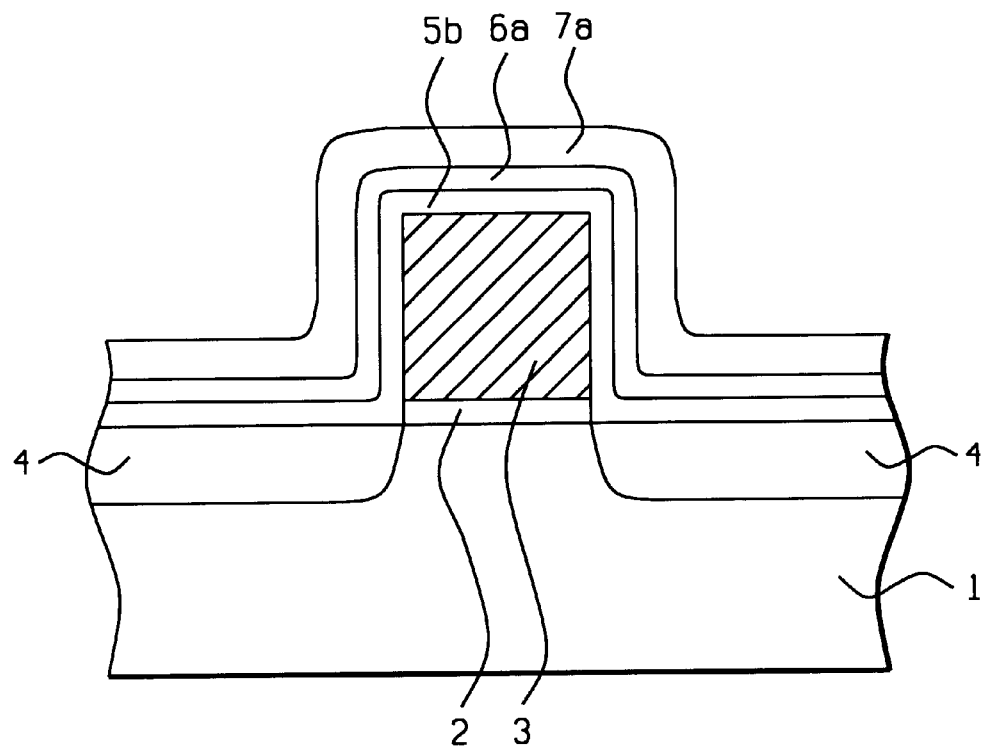

The formation of the composite insulator spacer continues with the deposition of silicon nitride and an overlying layer of silicon oxide. Silicon nitride layer 6a, is deposited via LPCVD or PECVD procedures, at a thickness between about 275 to 325 Angstroms, while overlying silicon oxide layer 7a, is obtained via LPCVD or PECVD procedures, at a thickness between about 900 to 1100 Angstroms, again using TEOS as a source. The result of these depositions are schematically shown in FIG. 4.

Figure 5:
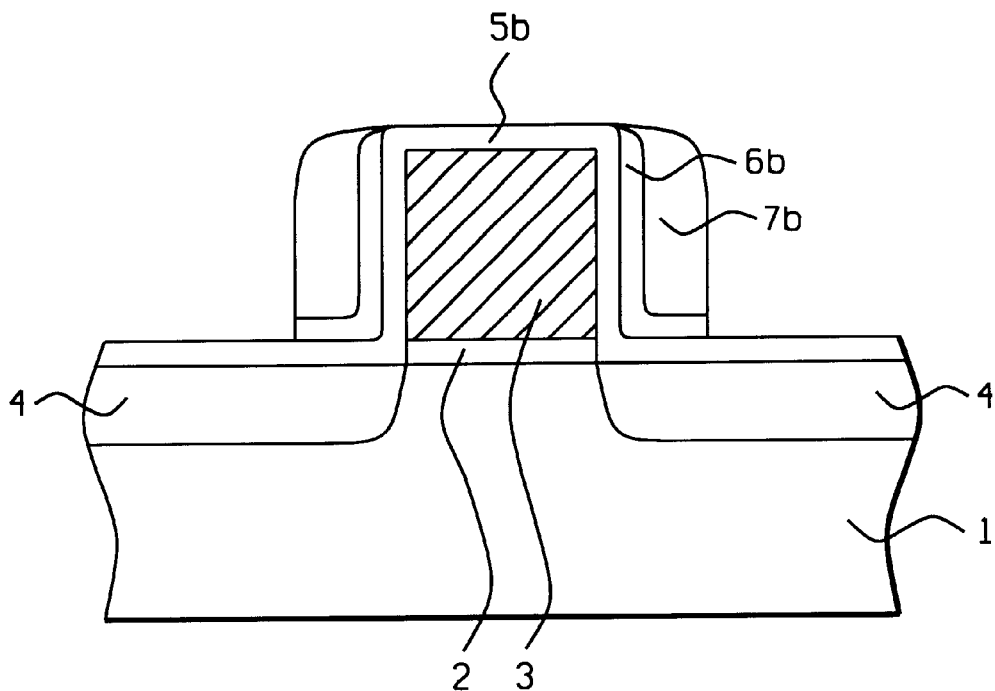
Figure 6:
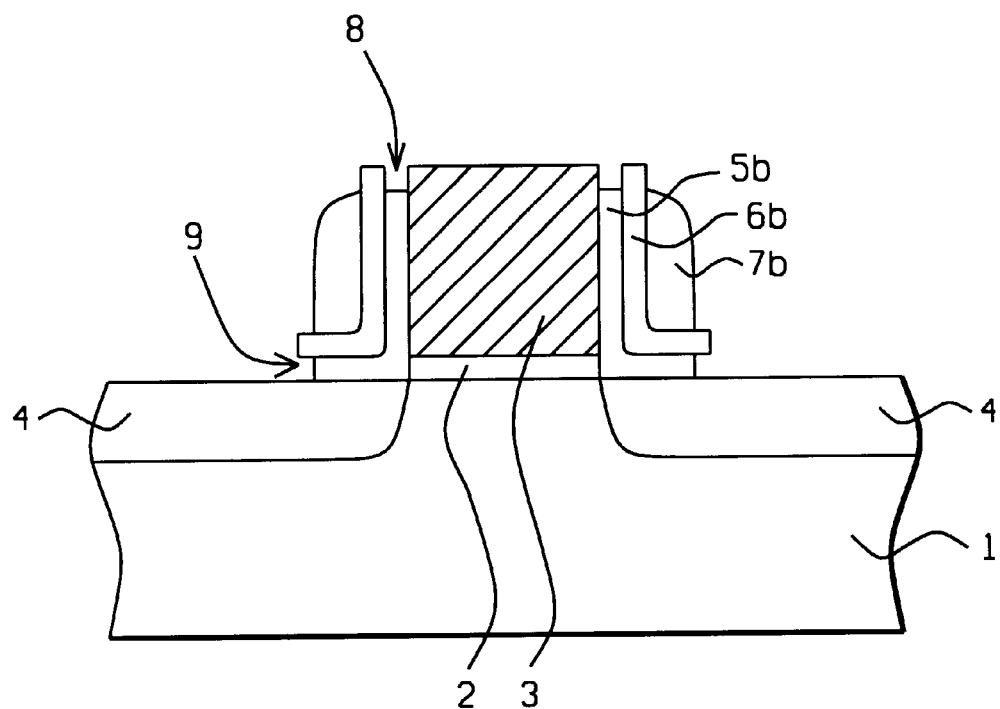

A first stage of the definition of the composite insulator spacer, is next addressed and schematically shown in FIG. 5. An anisotropic RIE procedure, using $CHF_3$ as an etchant for silicon oxide layer 7a, is used to define silicon oxide spacer component 7b. A second stage of the anisotropic RIE procedure employs $Cl_2$ as a selective etchant for silicon nitride layer 6a, resulting in silicon nitride spacer component 6b. The selectivity, or the high etch rate ratio of silicon nitride to silicon oxide, allowed the second stage of the anisotropic RIE procedure to terminate at the appearance of silicon oxide layer 5b. The second stage of the composite insulator spacer definition entails a wet etch procedure performed to densified silicon oxide layer 5b. A first 100:1 DHF procedure is used to remove portions of densified silicon oxide layer 5b, not covered by silicon oxide spacer component 7b, or by silicon nitride spacer component 6b, resulting in silicon oxide spacer component 5b. The composite insulator spacer, shown schematically in FIG. 6, is now comprised of overlying, silicon oxide spacer component 7b, silicon nitride spacer component 6b, and underlying, silicon oxide spacer component 5b. The first 100:1 DHF procedure is performed for a time between about 0.5 to 5.0 min, resulting in thinning of exposed silicon oxide spacer component 7b. Of greater importance is the formation of undercut region 9, the region of densified silicon oxide layer 5b, underlying silicon nitride spacer component 6b, that was removed during the first 100:1 DHF procedure. Undercut region 9, extends between about 275 to 325 Angstroms, underlying silicon nitride spacer component 6b. Without the densification of silicon oxide layer 5a, supplied by the RTA procedure, undercut region 9, at this point of the process flow, would have extended between about 375 to 400 Angstroms underlying silicon nitride spacer component 6b. The portion of densified silicon oxide layer 5b, exposed at the top edge, butting gate structure 3, is also subjected to the first 100:1 DHF procedure, resulting in notch 8, shown schematically in FIG. 6.

Figure 7:
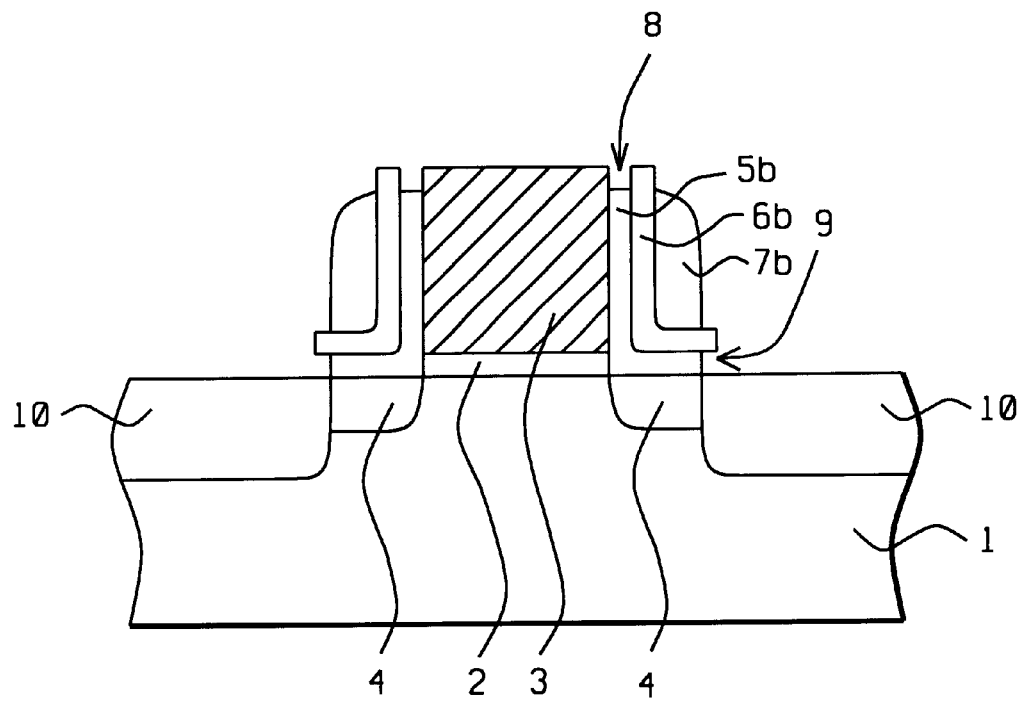
Figure 8:
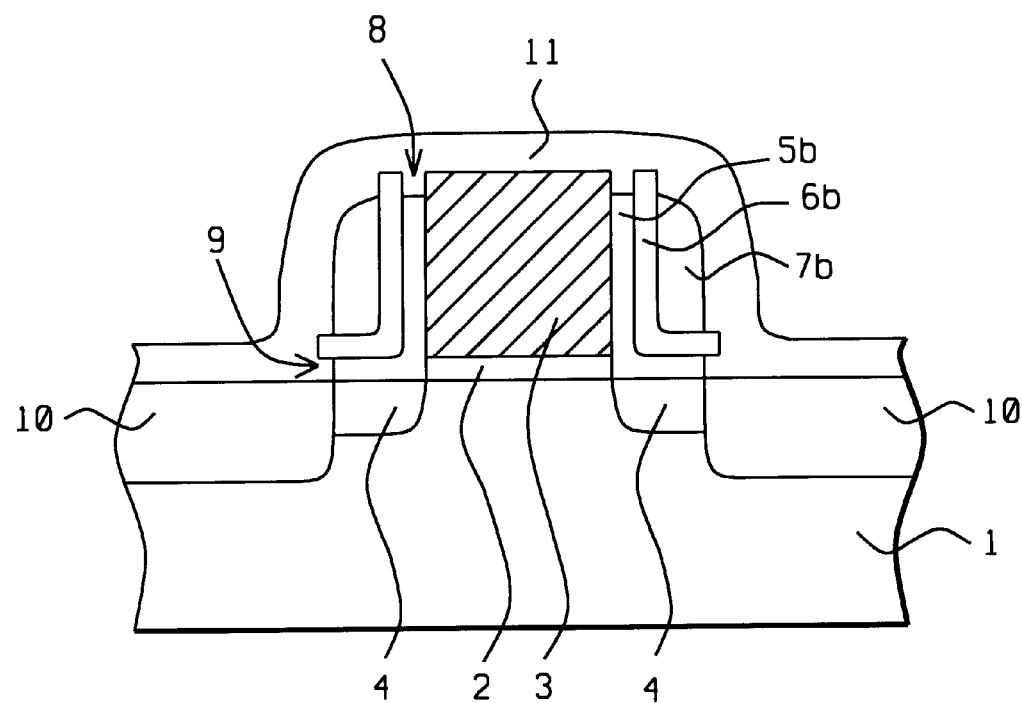

An ion implantation procedure is next performed to supply the dopants needed to create heavily doped source/drain region 10. The procedure is performed via implantation of arsenic or phosphorous ions, at an energy between about 10 to 60 KeV, at a dose between about 1E12 to 5E13 atoms/cm², in an area of semiconductor substrate 1, not covered by gate structure 3, or by the composite insulator spacer. This is schematically shown in FIG. 7. Prior to performing an anneal procedure to activate the implanted ions of heavily doped source/drain region 10, an RPO layer (resistor protect oxide) layer is deposited to protect underlying MOSFET elements during the activation anneal cycle. RPO layer 11, shown schematically in FIG. 8, comprised of silicon oxide, is obtained at a thickness between about 200 to 450 Angstroms, via plasma enhanced chemical vapor deposition (PECVD) procedures, performed at a temperature between about 350 to 450° C., using silane and oxygen as reactants. Activation of the implanted ions of heavily doped source/drain region 10, is now carried out via an RTA procedure, performed at a temperature between about 800 to 1100° C., for a time between about 10 to 90 sec, in an inert ambient. The previously annealed and densified silicon oxide layer 5b, now subjected to the heavily doped source/drain RTA procedure, will now exhibit even a lower removal rate when subjected to subsequent 100:1 DHF procedures.

Figure 9:
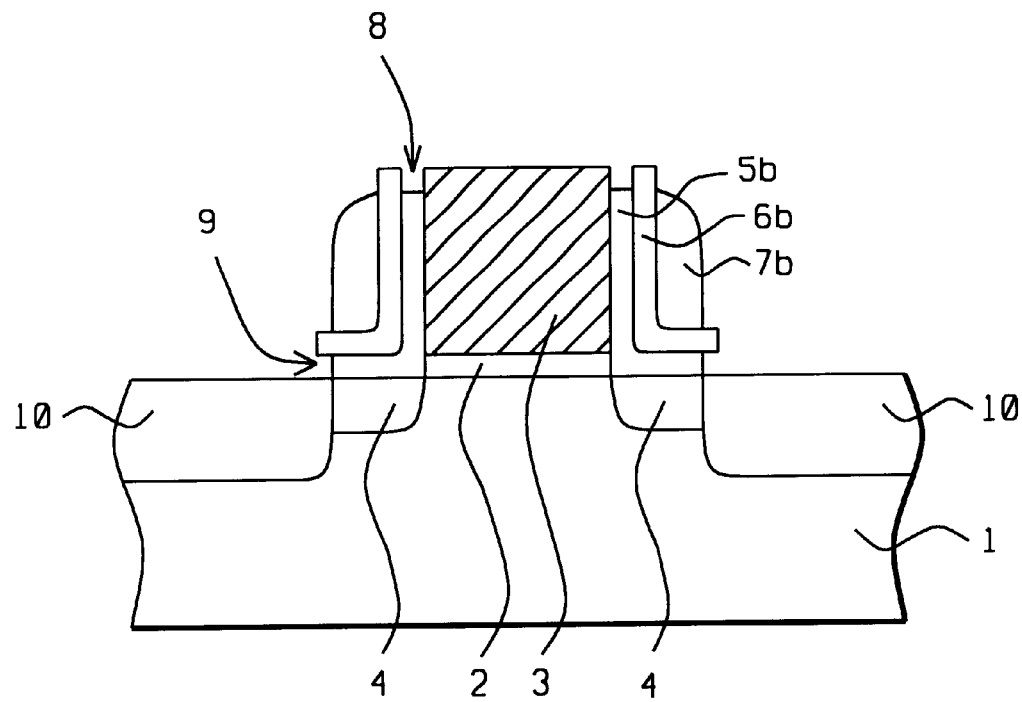

Removal of protective RPO layer 11, is next accomplished using a second 100:1 DHF solution. This procedure, performed for a time between about 2 to 4 min, completely removes the fast etching RPO layer, which features an etch rate between about 300 to 500 Angstroms/min in 100:1 DBF. The 100:1 DHF procedure is then continued to etch exposed regions of silicon oxide spacer component 5b. Undercut region 9, exposed to the second 100:1 DHF procedure, enlarges to between about 420 to 450 Angstroms, underlying silicon nitride spacer component 6b. In addition to notch 8, extending deeper as a result of exposure to the second 100:1 DHF procedure, exposed silicon oxide spacer component 7b, also thins. Prior to deposition of the metal layer needed for formation of a metal silicide, a pre-metal clean, entailing a third 100:1 DHF procedure is used for a time between about 0.5 to 2.0 min. The third 100:1 DHF procedure further increases undercut region 9, now extending between about 525 to 575 Angstroms, underlying silicon nitride spacer component 6b. This is schematically shown in FIG. 9. Without the densification procedure applied to silicon oxide layer 5a, prior to definition of the composite insulator spacer, the faster etching silicon oxide layer would have experienced removal of, or an undercut region totalling between about 700 to 800 Angstroms, as a result of the three 100:1 DHF procedures. Densification of this layer, via an RTA procedure dually used to activate the implanted ions of lightly doped source/drain region 4, decreased the level of undercut by at least 200 Angstroms. The third 100:1 DHF procedure again increased the extent of notched region 8, and also continued the thinning of silicon oxide spacer component 7b.

Figure 10:
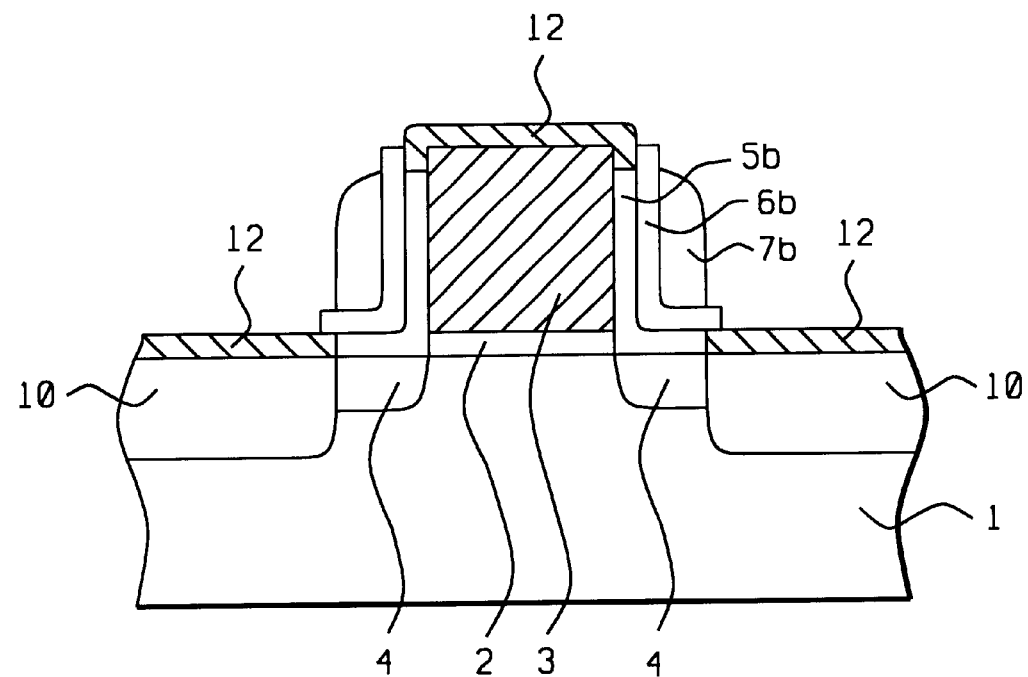

A metal layer, such as cobalt, is next deposited via plasma vapor deposition procedures, at a thickness between about 50 to 100 Angstroms. An anneal procedure, such as an RTA procedure, is then performed at a temperature between about 450 to 550° C., for a time between about 20 to 60 sec, forming metal silicide, or cobalt silicide layer 12, on the top surface of gate structure 3, and on the top surface of heavily doped source/drain region 10. Regions in which the metal layer overlaid the composite insulator spacer, remained unreacted- The unreacted portions of metal silicide layer 12, are then selectively removed in a solution comprised of $H_2O_2$—$NH_4OH$, at a temperature between about 50 to 100° C. the result of these procedures is schematically shown in FIG. 10. Of importance is formation of the metal silicide layer in undercut region 9. If undercut region 9, were not kept at a minimum as a result of the densification procedure applied to silicon oxide layer 5a, the distance of metal silicide on the heavily doped source/drain region, to gate structure 3, would have been less, possibly resulting in gate to substrate shorts or leakage.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a metal oxide semiconductor field effect transistor (MOSFET), device on a semiconductor substrate, featuring a composite insulator spacer formed on the sides of a gate structure, comprising the steps of:

forming a gate structure on an underlying gate insulator layer;

performing a first ion implantation procedure to place a first group of ions in a region of said semiconductor substrate, not covered by said gate structure;

depositing a first silicon oxide layer;

performing a first anneal procedure to densify said first silicon oxide layer, and to activate said first group of ions resulting in formation of a lightly doped source/drain region;

depositing a silicon nitride layer;

depositing a second silicon oxide layer;

performing an anisotropic dry etch procedure to form a second silicon oxide spacer component, and a silicon nitride spacer component;

performing a first wet etch procedure to remove exposed portions of densified, first silicon oxide layer, defining a first silicon oxide spacer component, and resulting in formation of said composite insulator spacer comprised of said second silicon oxide spacer component, said silicon nitride spacer component, and said first silicon oxide spacer component;

performing a second ion implantation procedure to place a second group of ions in a region of said semiconductor substrate, not covered by said gate structure, or by said composite insulator spacer, depositing third silicon oxide layer;

performing a second anneal procedure to activate said second group of ions resulting in formation of a heavily doped source/drain region;

performing a second wet procedure to remove said third silicon oxide layer;

performing a pre-metal deposition, third wet etch procedure; and forming a metal silicide layer on said heavily doped source/drain region, and on top surface of said gate structure.

2. The method of claim 1, wherein said gate insulator layer is comprised of silicon dioxide, obtained via thermal oxidation procedures at a thickness between about 20 to 70 Angstroms.

3. The method of claim 1, wherein said gate structure is a polysilicon gate structure, formed from an in situ doped polysilicon layer, in turn obtained via LPCVD procedures to a thickness between about 1000 to 3000 Angstroms.

4. The method of claim 1, wherein the width of gate structure is between about 0.13 to 0.35 um.

5. The method of claim 1, wherein said first ion implantation procedure, used to supply said first group of ions for said lightly doped source/drain region, is performed using arsenic or phosphorus ions, at an energy between about 2 to 30 KeV, at a dose between about 1E12 to 5E13 atoms/cm$^2$.

6. The method of claim 1, wherein said first silicon oxide layer is obtained via LPCVD or PECVD procedures, at a thickness between about 125 to 175 Angstroms, using tetraethylorthosilicate (TEOS) as a source.

7. The method of claim 1, wherein said first anneal procedure, used to density said first silicon oxide layer, and used to activate said first group of said ions, is a rapid thermal procedure, performed at a temperature between about 800 to 1100° C., for a time between about 10 to 90 sec, in an argon or nitrogen ambient.

8. The method of claim 1, wherein said silicon nitride layer is obtained via LPCVD or PECVD procedures, at a thickness between about 275 to 325 Angstroms.

9. The method of claim 1, wherein said second silicon oxide layer is obtained via LPCVD or PECVD procedures, at a thickness between about 900 to 1100 Angstroms, using TEOS as a source.

10. The method of claim 1, wherein said anisotropic dry etching procedure is an anisotropic RIE procedure, using $CHF_3$ as an etchant for said second silicon oxide layer, defining said second silicon oxide spacer component, and using $Cl_2$ as a selective etchant for said silicon nitride layer, defining said silicon nitride spacer component.

11. The method of claim 1, wherein said first wet etch procedure is performed using a 100:1 DHF solution, (100 parts $H_2O$, 1 part HF), etching said densified, first silicon oxide layer at a rate between about 115 to 135 Angstroms/min.

12. The method of claim 1, wherein said second ion implantation procedure, used to supply said second group of ions for said heavily doped source/drain region, is performed using arsenic or phosphorus ions, at an energy between about 10 to 60 KeV, at a dose between about 1E12 to 5E13 atoms/cm$^2$.

13. The method of claim 1, wherein said third silicon oxide is obtained at a thickness between about 200 to 450 Angstroms, via PECVD procedures, performed at a temperature between about 350 to 450° C., using silane and oxygen as reactants.

14. The method of claim 1, wherein said second wet etch procedure, used to remove said third silicon oxide layer, is performed using a 100:1 DHF solution, for a time between about 2 to 4 min.

15. The method of claim 1, wherein the removal rate of said third silicon oxide layer, in a 100:1 DHF solution, is between about 300 to 500 Angstroms/min.

16. The method of claim 1, wherein said third wet etch procedure, used for a pre-metal deposition clean, is performed using a 100:1 DBF solution.

17. A method of forming a composite insulator spacer on the sides of a MOSFET device gate structure, on a semiconductor substrate, featuring an anneal procedure used to activate implanted ions for a lightly doped source/drain region, and to densily a silicon oxide layer to be used for an underlying insulator spacer component for said composite insulator spacer, comprising the steps of:

providing said gate structure;

performing an ion implantation procedure to place ions in a region of said semiconductor substrate, not covered by said gate structure;

depositing a first silicon oxide layer;

performing said anneal procedure to convert said first silicon oxide layer to a densified first silicon oxide layer, and to activate said group of ions resulting in formation of said lightly doped source/drain region;

depositing a silicon nitride layer;

depositing a second silicon oxide layer;

performing an anisotropic reactive ion etch procedure to form a second silicon oxide spacer component, and a silicon nitride spacer component, located overlying a first portion of said densified first silicon oxide layer; and removing second portions of said densified first silicon oxide not covered by said second silicon oxide spacer component, or by said silicon nitride spacer component, defining a densified first silicon oxide spacer component, and resulting in the definition of said composite insulator spacer comprised of overlying said second silicon oxide spacer component, said silicon nitride spacer component, and underlying said densified first silicon oxide spacer component.

18. The method of claim 17, wherein said gate structure is a polysilicon gate structure, at a thickness between about 1000 to 3000 Angstroms, and defined with a width between about 0.13 to 0.35 um.

19. The method of claim 17, wherein said ion implantation procedure used to supply said group of ions for said lightly doped source/drain region, is performed using arsenic, or phosphorus ions, at an energy between about 2 to 30 KeV, at a dose between about 1E12 to 5E13 atoms/cm$^2$.

20. The method of claim 17, wherein said first silicon oxide layer is obtained via LPCVD or PECVD procedures, at a thickness between about 125 to 175 Angstroms, using tetraethylorthosilicate (TEOS) as a source.

21. The method of claim 17, wherein said anneal procedure, used to density said first silicon oxide layer, and to activate group of said ions, is a rapid thermal procedure, performed at a temperature between about 800 to 1100° C., for a time between about 10 to 90 sec, in an argon or nitrogen ambient.

22. The method of claim 17, wherein said silicon nitride layer is obtained via LPCVD or PECVD procedures, at a thickness between about 275 to 325 Angstroms.

23. The method of claim 17, wherein said second silicon oxide layer is obtained via LPCVD or PECVD procedures, at a thickness between about 900 to 1100 Angstroms, using TEOS as a source.

24. The method of claim 17, wherein said anisotropic reactive ion etch procedure is performed using $CHF_3$ as an etchant for said second silicon oxide layer, defining said second silicon oxide spacer component, and performed using $Cl_2$ as a selective etchant for said silicon nitride layer, defining said silicon nitride spacer component.

25. The method of claim 17, wherein said second portions of said densified first silicon oxide layer are removed via a wet etch procedure using a 100:1 DHF solution, (100 parts $H_2O$, 1 part HF), for a time between about 2 to 4 min.

26. The method of claim 17, wherein the removal rate of said densified first silicon oxide layer, in a 100:1 DHF solution, is between about 115 to 135 Angstroms/min.

* * * * *

UNITED STATES PATENT AND TRADEMARK OFFICE
CERTIFICATE OF CORRECTION

PATENT NO.    : 6,448,167 B1
DATED         : September 10, 2002
INVENTOR(S)   : Ling-Sung Wang and Ying-Lin Chen It is certified that error appears in the above-identified patent and that said Letters Patent is hereby corrected as shown below:

<u>Title page,</u>
Item [74], delete "Stephen B. Acke" and replace with -- Stephen B. Ackerman --.

Signed and Sealed this

Eighteenth Day of February, 2003

JAMES E. ROGAN
*Director of the United States Patent and Trademark Office*